(12) United States Patent
Liu et al.

(10) Patent No.: US 6,639,405 B2
(45) Date of Patent: Oct. 28, 2003

(54) NMR SPECTROSCOPY DATA RECOVERY METHOD AND APPARATUS

(75) Inventors: Haiying Liu, Maplewood, MN (US); Wei Chen, Roseville, MN (US); Kamil Ugurbil, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 37 days.

(21) Appl. No.: 10/067,180

(22) Filed: Feb. 4, 2002

(65) Prior Publication Data

US 2002/0140426 A1 Oct. 3, 2002

Related U.S. Application Data

(62) Division of application No. 09/824,511, filed on Apr. 2, 2001.

(51) Int. Cl.[7] .................................................. G01V 3/00
(52) U.S. Cl. ........................................................ 324/307
(58) Field of Search ................................. 329/307, 309

(56) References Cited

U.S. PATENT DOCUMENTS

| | | | | |
|---|---|---|---|---|
| 4,521,733 A | | 6/1985 | Bottomley et al. | 324/309 |
| 4,599,565 A | | 7/1986 | Hoenninger, III et al. | 324/309 |
| 4,684,891 A | | 8/1987 | Feinberg | 324/309 |
| 4,896,113 A | | 1/1990 | Pelc | 324/309 |
| 5,243,284 A | | 9/1993 | Noll | 324/309 |
| 5,341,099 A | | 8/1994 | Suzuki | 324/309 |
| 5,603,319 A | | 2/1997 | Kuhara et al. | 128/653.2 |
| 5,627,469 A | | 5/1997 | Hong et al. | 324/309 |
| 5,742,163 A | * | 4/1998 | Liu et al. | 324/309 |
| 5,869,964 A | | 2/1999 | Kuhara et al. | 324/309 |
| 6,016,057 A | * | 1/2000 | Ma | 324/309 |
| 6,023,634 A | | 2/2000 | Hanawa et al. | 600/410 |
| 6,166,545 A | | 12/2000 | Polzin et al. | 324/309 |
| 6,198,283 B1 | * | 3/2001 | Foo et al. | 324/309 |
| 6,331,776 B1 | * | 12/2001 | Debbins et al. | 324/309 |
| 6,351,122 B1 | * | 2/2002 | Polzin et al. | 324/309 |
| 6,362,620 B1 | * | 3/2002 | Debbins et al. | 324/309 |
| 6,492,812 B1 | * | 12/2002 | Debbins et al. | 324/309 |

FOREIGN PATENT DOCUMENTS

| | | | | |
|---|---|---|---|---|
| EP | 0296834 | 12/1988 | | G01N/24/08 |
| EP | 0564973 | 10/1993 | | G01R/33/56 |

* cited by examiner

Primary Examiner—Diego Gutierrez
Assistant Examiner—Dixomara Vargas
(74) Attorney, Agent, or Firm—Schwegman, Lundberg, Woessner & Kluth, P.A.

(57) ABSTRACT

NMR spectroscopy data recovery methods and apparatus for improving the quality of an NMR spectrum are disclosed. The NMR spectrum is improved by acquiring more than the half spin-echo data signal and using an iterative numerical method to reconstruct the missing data points of the corresponding full symmetrical spin-echo data signal. The method includes filtering the initial data signal to extract a low-resolution phase term. The low-resolution phase term is used to form a phase-constrained initial data signal, which is Fourier-transformed to obtain a reconstructed data signal. The reconstructed data signal is modified to include the original spin-echo signal data. The formation of the reconstructed spin-echo data signal and subsequent modification is iterated until convergence is obtained. The reconstructed data signal is then Fourier-transformed to form a reconstructed NMR spectrum.

30 Claims, 8 Drawing Sheets

NMR SPECTROSCOPY DATA RECOVERY METHOD AND APPARATUS

CROSS REFERENCE TO RELATED APPLICATION

This application is a divisional of U.S. patent application Ser. No. 09/824,511, filed Apr. 2, 2001, which is incorporated herein by reference.

FIELD OF THE INVENTION

The present invention pertains to nuclear magnetic resonance (NMR) spectroscopy, and in particular to NMR apparatus for and methods of improving the quality of an NMR spectrum.

BACKGROUND OF THE INVENTION

The nuclei of many atoms possess non-zero angular momentum or spin. Where the nuclei have a net charge, the spin produces a magnetic moment. When a sample containing such nuclei is placed in a constant external magnetic field (e.g., $B_0$ in the z-direction), the net magnetic moments of the nuclei attempt to line up with the magnetic field. Some nuclei align themselves parallel to the magnetic field (i.e., in the positive z-direction), while others align themselves anti-parallel to the magnetic field (i.e., in the negative z-direction). These two different orientations ("states") of the nuclei have different energies, with the population difference being inversely related to the energy difference between the two states.

At equilibrium, more nuclei will be in the low-energy state than in the high-energy state. The individual magnetic moments, however, cannot perfectly line up with the external magnetic field, but rather are tilted at an angle and thus precess at an angle about the imposed magnetic field axis at a particular frequency, known as the Larmor frequency.

If an oscillating external magnetic field (typically, pulses of electromagnetic energy in the radio frequency ("rf") range) is applied to the nuclei at the Larmor frequency, a resonance occurs, whereby the rf energy is absorbed due to the excess spin population of nuclei in the low energy state. This causes the magnetic moments in the lower energy state to flip to the higher energy state. Depending on the duration of the rf pulse, the populations of the two energy states will be perturbed from the equilibrium populations. When the oscillating magnetic field ceases, the precession of magnetic moments generates an electromagnetic signal that can be detected by a receiver coil appropriately arranged relative to the sample. The receiver coil converts the received signal into an electrical signal, which can then be analyzed. The populations of parallel and antiparallel nuclei return to an equilibrium state with a characteristic time period $T_1$, known as the nuclear spin-lattice or longitudinal relaxation time.

Different nuclei precess at different frequencies. Accordingly, at a particular magnetic field strength, the nuclei will generally absorb energy at certain characteristic radio frequencies. Also, nuclei of the same nuclear species will absorb energy at shifted frequencies, depending upon their molecular environment. This shift, called the "chemical shift," is characteristic of an atom's position in a given molecule. Plots of chemical shift (typically measured in parts-per-million or "ppm") vs. signal strength (e.g., mV) reveal the energy absorption peaks ("resonances") of the nuclei and provide a chemical analysis or "spectrum" of a given sample subject to NMR. In particular, NMR spectroscopy is used to characterize the structure and dynamics of proteins, nucleic acids, carbohydrates and their complexes, much in the way crystallography is used. NMR is also used in vivo to monitor and characterize living tissue, and in particular has been used to monitor defects in energy metabolism in animals. Details about NMR, including NMR spectroscopy, can be found in the book by S. Webb, *The Physics of Medical Imaging*, Institute of Physics Publishing, Ltd., 1992, Chapter 8.

A technique used in NMR to acquire a signal from the sample being measured is called the "spin echo" technique. After the initial rf pulse is turned off, the magnetic moments of the nuclei begin to once again precess in phase around the constant magnetic field $B_0$. However, the individual magnetic moments begin to diverge as some nuclei precess faster and some precess slower than the central Larmor frequency. When the magnetic moments are first tipped by the rf pulse, a relatively strong signal or voltage is induced in the receiver coils. However, the signal gradually decreases due to energy exchange between spins (with a spin-spin relaxation time constant $T_2$) and the dephasing of the spins, both of which are cumulatively characterized by a relaxation time $T_2^*$. This signal is called the "free induction decay" (FID).

A "spin echo" or subsequent representation of the FID can be generated by bringing the spins of the magnetic moments back into phase coherence by subjecting the sample to another rf pulse, called a "refocusing pulse." For example, if, at a time $\tau$ after the nuclear spins are tipped by a first rf pulse of appropriate frequency, magnitude, and duration (a 90° pulse), another electromagnetic signal of appropriate frequency, magnitude, and duration is applied to effect a 180° nutation of the nuclear spins (a 180° pulse), each individual spin is effectively rotated by 180° (in the rotating frame of reference). As a result, the phase becomes the negative of the phase accumulated before the 180° pulse in the former case. The magnetic moments that had been precessing faster than the central Larmor frequency, and thus "ahead" of the other magnetic moments before the 180° pulse, are now "behind" the slower magnetic moments. As the faster magnetic moments "catch-up" to the slower magnetic moments, a stronger and stronger signal is induced in the receiver coil until the faster magnetic moments pass the slower ones. The signal begins to fade as the magnetic moments spread out. In this manner, a so-called "spin echo" signal of the FID is generated. The peak amplitude of the spin echo depends upon the transverse or spin-spin relaxation time constant $T_2$.

Ideally, the envelope of a spin-echo voltage signal is symmetrical in time. However, because of timing limitations between the initial rf excitation of the sample and the subsequent rf refocusing pulse, the initial portion of the spin-echo signal is generally not recoverable. Consequently, in practice, only a portion (e.g., half or slightly more than half) of the spin-echo signal can be used to obtain the associated NMR spectrum. The resulting spectrum is essentially a properly phased real component of the Fourier-transformed raw half spin-echo voltage signal. Since the imaginary part of the spectrum is more dispersive in terms of peak width, the NMR spectrum is often displayed in a real mode rather than the absolute value mode.

While this approach sometimes provides for an adequate spectrum, it is much preferred to have a spectrum with the highest possible signal to noise ratio (SNR) and spectral resolution, particularly for samples where the resonance peaks are closely spaced and the peak of tissue water needs to be suppressed. To date, NMR spectroscopists have had to use the half spin echo and accept the poor signal to noise ratio (SNR) and spectral resolution available from the half spin-echo signal.

Accordingly, there is need for a technique that could provide for high-resolution NMR spectra.

SUMMARY OF THE INVENTION

The present invention improves the quality of an NMR spectrum by acquiring more than half echo data and using an iterative numerical method to reconstruct the missing data points of the corresponding full symmetrical echo data.

A first aspect of the invention is a method of forming a high-resolution NMR spectrum. The method includes acquiring an initial partial spin-echo signal from a sample, the signal beginning at a time $t=t_i$ and having an echo-center portion. A low-resolution phase is then obtained from the echo-center portion, preferably by filtering the signal to isolate the echo-center and then Fourier-transforming the filtered signal. The partial spin-echo signal is then Fourier-transformed to obtain an initial spectrum having an initial phase. The phase of the initial spectrum is then replaced with the low-resolution phase to create a phase-constrained spectrum. The phase-constrained spectrum is then Fourier-transforming to obtain a reconstructed signal having data for time $t<t_i$. The data in the reconstructed signal for time $t>t_i$ is then replaced with that of the initial signal to form a modified reconstructed signal. This modified signal is then Fourier-transformed to obtain a new initial spectrum with a new initial phase. The acts from replacing the initial phase in the initial spectrum with the low-resolution phase to obtaining a reconstructed signal are iterated until the reconstructed remains substantially unchanged from the previous iteration. The reconstructed signal is then Fourier-transformed to obtain a high-resolution NMR spectrum.

A second aspect of the invention is an apparatus for obtaining a high-resolution NMR spectrum of a sample. The apparatus includes a magnet having an inner surface that defines an open volume and that creates a constant magnetic field within the open volume. Gradient coils are arranged adjacent the magnet inner surface. An rf coil is arranged adjacent the gradient coils opposite the magnet inner surface and adapted to be in electromagnetic communication with the sample. A receiving unit is electrically connected to the rf coil for receiving signals detected by the rf coil. A power supply is electrically connected to the gradient coils, for creating gradient magnetic fields within the open volume. A receiving unit is electrically connected to the rf coil. An analog-to-digital converter is electrically connected to the receiving unit and converts the analog signal from the rf coil to a digital partial spin-echo signal. A computer system is electrically connected to the analog-to-digital converter and receives the digital signal. The computer system includes a processor programmed to condition and iteratively process the digital signal so as to form a reconstructed spin-echo signal representative of the high-resolution NMR spectrum.

A third aspect of the invention is a computer-readable medium having computer-executable instructions to cause the computer system of the apparatus of the present invention to perform the method of the first aspect of the present invention, described briefly above.

DETAILED DESCRIPTION OF THE INVENTION

Figure 1:
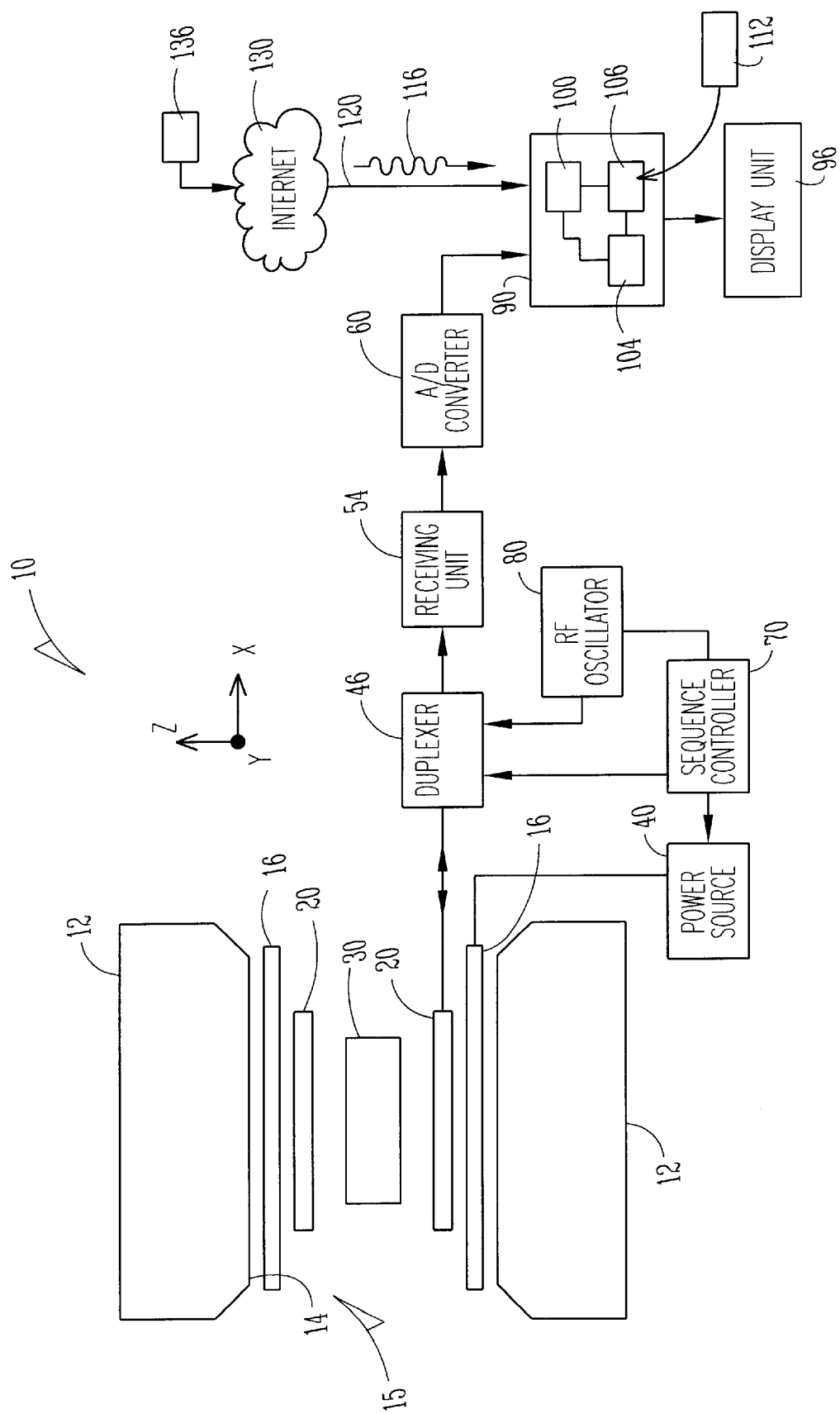
FIG. 1 is a schematic diagram of an NMR apparatus of the present invention.

The present invention pertains to nuclear magnetic resonance (NMR) spectroscopy, and in particular to NMR apparatus and methods that acquire more than half spin-echo data in a NMR spectroscopy experiment and that use an iterative data recovery procedure to improve the quality of an NMR spectrum in terms of the SNR and the spectral resolution.

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing form the scope of the present invention.

The following detailed description is, therefore, not to be taken in a limiting sense, and the scope of the present invention is defined only by the appended claims.

In the description below, data that in practice is treated as discrete in NMR spectroscopy is regarded as continuous for simplicity of description and to make the mathematical notation compact. It will be appreciated by one skilled in the art that the method of performing discrete analysis based on the equations provided is well-understood in the art, and is described in any one of a number of textbooks, such as the textbook by Bracewell, entitled *The Fourier Transform and its Applications*, second edition, McGraw Hill Book Company, Chapter 18.

Also in the description below, the following notation is used:

F { } denotes the Fourier transform of the quantity within the brackets;

$F^{-1}$ { } denotes the inverse Fourier transform of the quantity within the brackets;

$V_I(t)$ is the initial partial spin-echo voltage signal. The partial spin-echo voltage signal is, in general, a complex-valued function that includes both amplitude and phase information; however, as the imaginary part of the signal corresponds to a phase delay, in the discussion below, $V_I(t)$ can be taken as the real-part of the voltage signal that corresponds to a single (i.e., one-dimensional) slice of the sample being measured. Generalization to multiple slices to perform sample localization is straightforward.

$V_F(t)$ is the central echo portion of the $V_I(t)$ obtained by filtering $V_I(t)$ about the echo center;

$V_S(t)$ is the smoothed partial spin-echo voltage signal obtained by filtering the initial portion of the signal $V_I(t)$;

$V_R(t)$ is the reconstructed spin-echo voltage signal;

$S_I(f)$ is the Fourier transform of $V_S(t)$ and represents the NMR spectrum associated with the smoothed initial partial spin-echo voltage signal;

$S_R(f)$ is the Fourier transform of $V_R(t)$ and represents the NMR spectrum associated with the reconstructed spin-echo voltage signal;

$S_{LR}(f)$ is the low-resolution NMR spectrum;

$\phi_{LR}$ is the low-resolution phase of the low-resolution NMR spectrum $S_{LR}(f)$;

$\Pi(t)$ is the rectangle function and is defined as: 1 for $(t_c-\Delta t)<t<(t_c+\Delta t)$ and 0 for all other values of t, wherein $t_c$ is the center of the echo-center;

H(t) is a truncated smoothing function and is defined as: 0 for $t<t_1$, h(t) for $t_1<t<t_2$, and 0 for $t_2<t$, wherein h(t) is a smoothly increasing function;

TE, TR=echo time, repetition time; and

PRESS=point resolved spectroscopy

Apparatus

FIG. 1 shows the essential features of an example embodiment of the NMR apparatus 10 of the present invention. NMR apparatus 10 is, in an a preferred example embodiment, created by replacing or adapting the computer system of a commercially available NMR apparatus, such as the Gyroscan ACS-NT 1.5 Tesla clinical MR system from Phillips, Inc., Best, The Netherlands, or the hybrid 4.0 Tesla whole-body MR system from Varian, Inc., Palo Alto, Calif. (console) and Oxford Magnet Technology, England (magnet).

NMR apparatus 10 comprises a strong (e.g., 1T or greater) magnet 12 with an inner surface 14 defining an open volume 15. Gradient coils 16 are arranged adjacent inner surface 14, and an rf coil 20 is arranged adjacent gradient coils 16 on the side opposite the magnet. A sample 30 to be subject to NMR spectral analysis is placed within rf coil 20. Sample 30 may be, for example, a section of a living organism, or a material whose chemical composition is to be determined.

Apparatus 10 further includes a power source 40 electrically connected to gradient coils 16, a duplexer 46 electrically connected to rf coil 20, a receiving unit 54 electrically connected to the duplexer, and an analog-to-digital (A/D) converter 60 electrically connected to the receiving unit. A sequence controller 70 is electrically connected to power source 40, and an rf oscillator 80 is electrically connected to the sequence controller and the duplexer.

Apparatus 10 also includes a computer system 90 electrically connected to A/D converter 60 and to a display unit 96. Computer system 90 is any digital or analog processing unit, such as a personal computer, workstation, set top box, mainframe server, servercomputer, laptop or the like capable of embodying the invention described herein. In an example embodiment, computer system 90 includes a processor 100, a memory device 104, a data storage unit 106, all electrically interconnected. Data storage control unit 106 may be, for example, a hard drive, CD-ROM drive, or a floppy disk drive that contains or is capable of accepting and reading a computer-readable medium 112. In an example embodiment, computer-readable medium is a hard disk, a CD, a floppy disk or the like. Computer-readable medium 112 contains computer-executable instructions to cause computer system 90 to perform the methods described below. A preferred computer system 90 is a workstation running a multi-tasking operating system, such as Unix® or VMS® or Windows NT®.

In another example embodiment, computer-readable medium 112 comprises a signal 116 traveling on a communications medium 120. In one example embodiment, signal 116 is an electrical signal and communications medium 120 is a wire, while in another example embodiment, the communications medium is an optical fiber and the signal is an optical signal. Signal 116 may, in one example, be transmitted over the Internet 130 to computer system 90 from another computer system 136.

With continuing reference to FIG. 1 and apparatus 10, in an example embodiment of operation, magnet 12 generates a static magnetic field (not shown) in the Z-direction. Power source 40 drives gradient coils 16 to generate gradient magnetic fields (not shown) in open volume 15 in the X, Y and Z directions. The gradient magnetic fields serve as a slice-selection gradient field, a phase-encoding gradient field, and a readout gradient field, respectively. The static and gradient magnetic field geometry is described in the '099 patent, which patent is incorporated by reference herein.

Figure 2A:
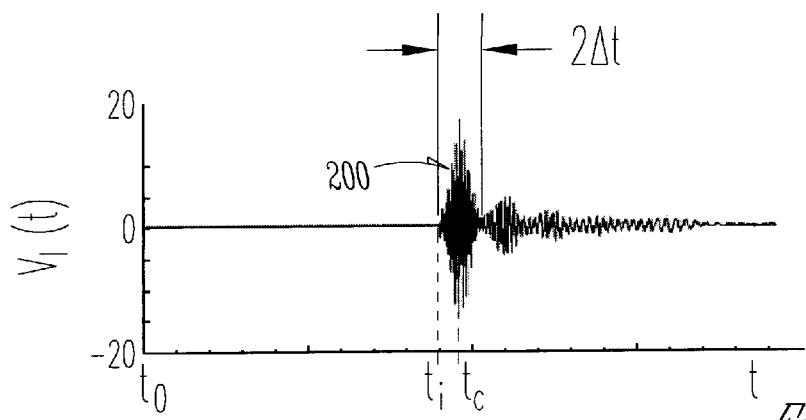
FIG. 2A is an exemplary plot of the initial voltage $V_I(t)$ vs. time for an initial partial spin-echo data signal from a sample of ethanol as measured using the NMR apparatus of FIG. 1 using the PRESS technique with TE=27 msec and a 1.5T magnetic field.

The ff coil 20 then generates electromagnetic waves (e.g., rf pulses) for excitation of the spins in sample 30, and also detects induced magnetic resonance (MR) signals emanating therefrom. In an alternative embodiment, a second rf coil (not shown) can also be used as a dedicated receiver. Where a single rf coil 20 serves as the transmitter of rf signals an as the detector for NMR signals, duplexer 46 is used to separate the transmitted rf pulses from the received NMR signals. Sequence controller 70 activates a predetermined rf pulse sequence so that the rf pulses provided to rf coil 20 by rf oscillator 80 are coordinated with the power provided to gradient coils 16 by power source 40. Receiving unit 54 receives the analog MR signals and passes them to A/D converter 60, which converts the analog MR signals into corresponding digital signals. The signals collectively represent the partial spin-echo data ("signal") from the sample. An exemplary initial partial spin-echo signal is a voltage signal $V_I(t)$, as is illustrated in FIG. 2A. The partial spin-echo signal is then passed to computer system 90.

In an example embodiment, computer system 90 is programmed with instructions (e.g., a computer program embodied in computer-readable medium 112 provided to computer system 90 directly to data storage unit 106, or via a signal 116) to implement the method of the present invention, described below, to process the initial partial spin-echo signal to create a reconstructed signal representing the complete spin-echo data from sample 30. The programmed instructions also provide for the creation of a reconstructed NMR spectrum from the reconstructed spin-echo data. In an example embodiment, display unit 96 displays the initial signal (e.g., voltage signal $V_I(t)$ of FIG. 2A, discussed below), as well as the reconstructed voltage signals and/or the NMR spectra corresponding to the original and reconstructed voltage signals, as discussed below. The final (reconstructed) NMR spectrum can be displayed in either real display mode or absolute display mode. In real mode, the real part of the spectrum is displayed, while in absolute display mode, the modular value of the spectrum is displayed.

Method

Example embodiments of the method of the present invention are now described with reference to flow diagram 300 of FIG. 3 and FIGS. 2A–2E and also to flow diagram 400 of FIG. 4 and FIGS. 2F–2G.

Figure 3:
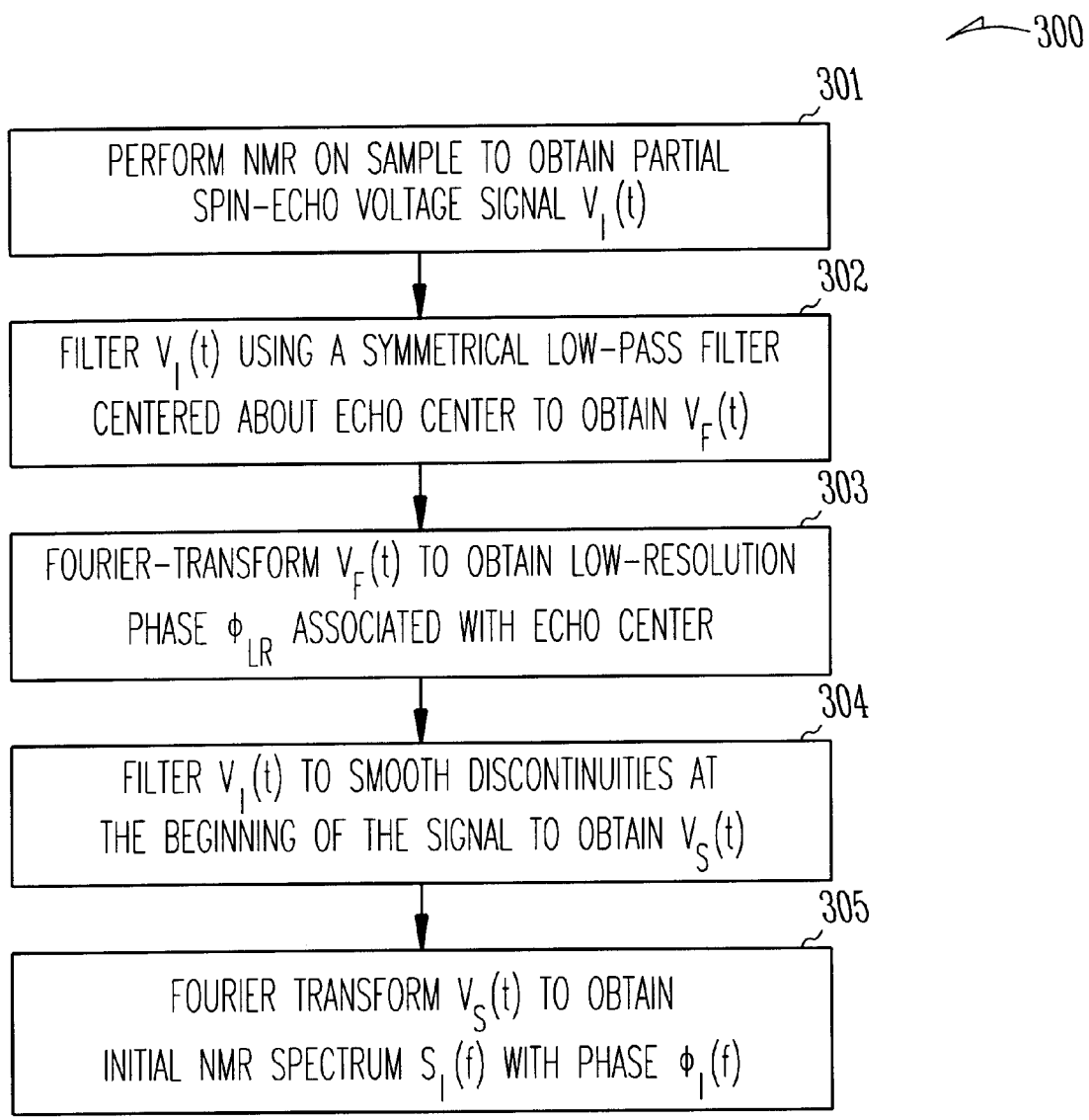
FIG. 3 is a flow diagram of the method of the present invention, which includes obtaining a partial spin-echo voltage $V_I(t)$, filtering the voltage signal $V_I(t)$ to obtain the low-resolution phase constraint $\phi_{LR}$ from the low-resolution spectrum, and smoothing the voltage signal $V_I(t)$ to obtain a smoothed voltage signal $V_S(t)$.
Figure 4:
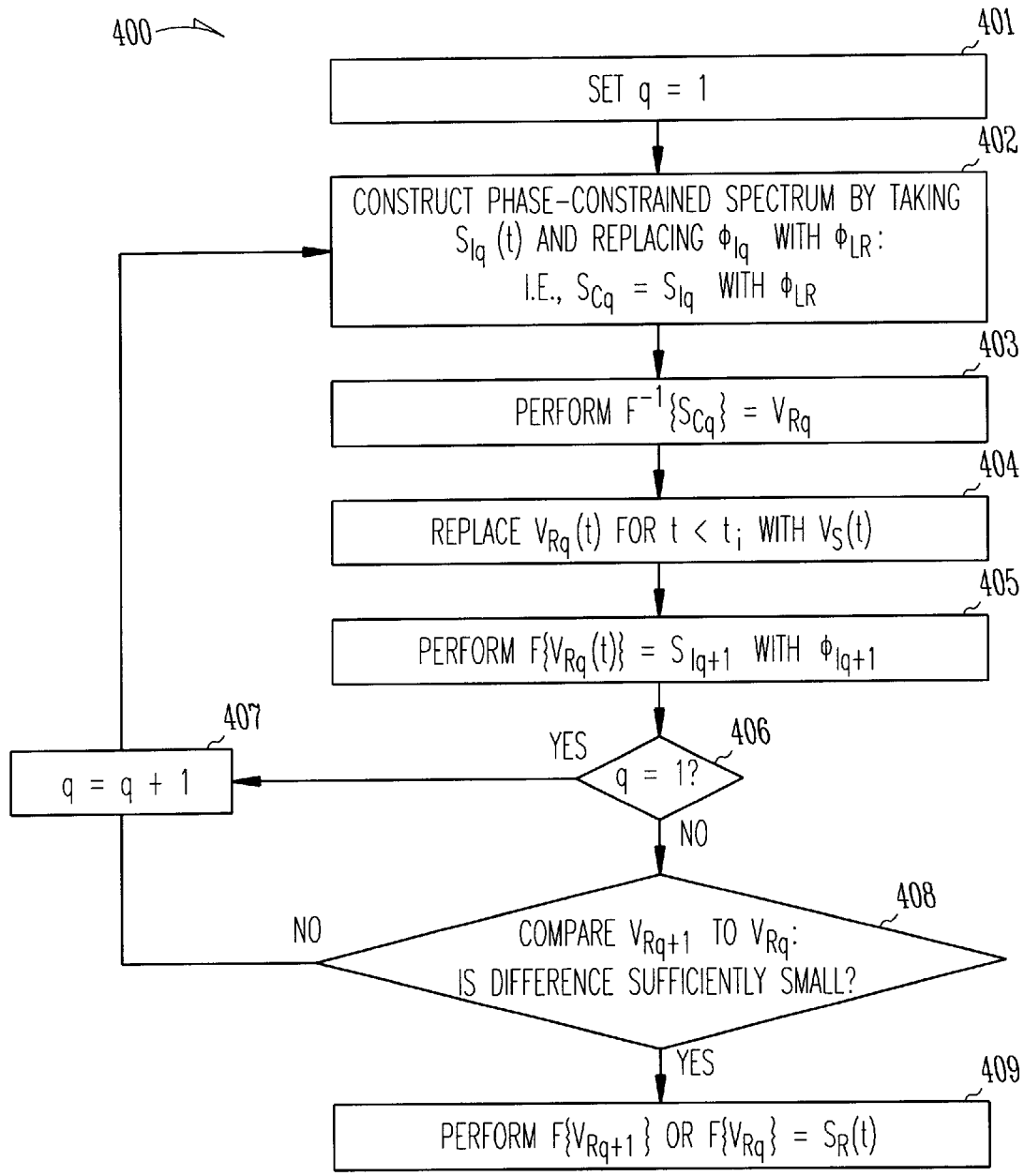
FIG. 4 is a flow diagram of the method of the present invention for iteratively reconstructing the voltage data absent from the smoothed version $V_S(t)$ of the initial partial spin-echo voltage signal $V_I(t)$, and reconstructing the NMR spectrum $S_R(f)$ from the reconstructed voltage signal $V_R(t)$.

With reference to FIG. 3, in 301, NMR is performed on sample 30 using apparatus 10 in the manner described above in connection with FIG. 1, to obtain an initial partial spin-echo voltage signal. In an example embodiment, this signal is a voltage $V_I(t)$. FIG. 2A is a partial spin-echo voltage signal $V_I(t)$ obtained from a sample of ethanol taken using the standard PRESS technique in apparatus 10. Voltage $V_I(t)$ has a echo center 200 centered about time $t_C$ with a width of $+/-\Delta t$. In theory, echo center 200 is perfectly symmetric about $t_C$, but in practice this is hardly so. Voltage signal $V_I(t)$ begins at time $t_i$, the time when the signal is first received by rf coil 20.

Figure 2B:
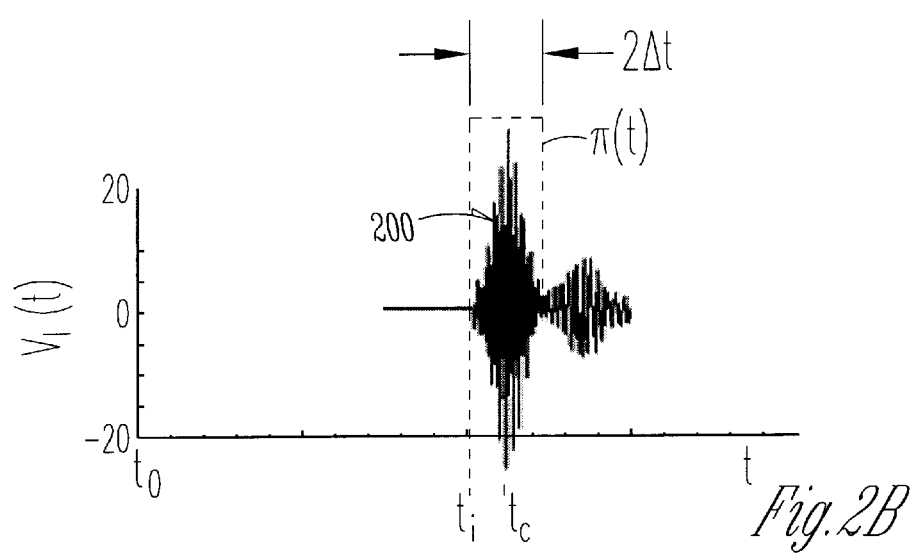
FIG. 2B is a close-up of the initial voltage $V_I(t)$ of FIG. 2A, showing a symmetrical bandpass filter centered about the echo-center.
Figure 2C:
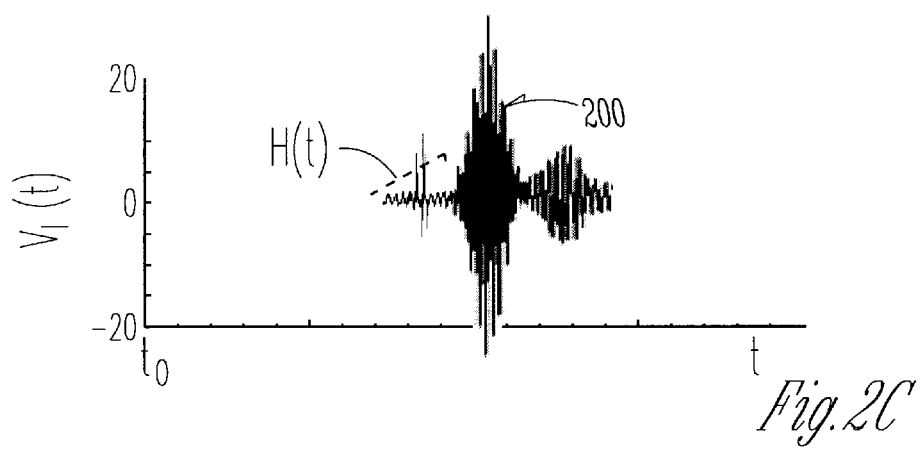
FIG. 2C is a close-up of the initial voltage $V_I(t)$ of FIG. 2A, showing the application of a truncated smoothing function at the beginning (time $t_i$) of the voltage signal, which shown to include spurious voltage values, in order to obtain a smoothed initial voltage signal $V_S(t)$.

With reference again to FIG. 3 and also to FIG. 2B, in 302 voltage signal $V_I(t)$ is filtered using a symmetrical bandpass filter centered around echo center 200 and time $t_C$, resulting in a filtered voltage signal $V_F(t)$. This is accomplish by performing the following operation:

$$V_F(t) = V_I(t) \cdot \Pi(t),$$

wherein $\Pi(t)$ is the rectangle function, defined above. This filtering step isolates echo center 200 from the initial voltage signal $V_I(t)$.

Next, in 303 the filtered voltage signal $V_F(t)$ is Fourier-transformed to obtain a low-resolution NMR spectrum $S_{LR}$(f). In practice, the Fourier transform is performed a as a discrete transform, and preferably a fast Fourier transform (FFT). Because of the slight asymmetry of echo center 200, low-resolution spectrum $S_{LR}(f)$ includes a low-resolution (i.e., slowly varying) phase term $\phi_{LR}(f)$.

It is known from physical considerations that the initial voltage data for times $t<t_i$ absent from $V_I(t)$ should resemble the data on the other side ($t>t_C$) of echo center 200. However, in practice discontinuities and spurious voltage values associated with the initial reception of the signal can adversely affect the symmetry of the signal and hence the quality of the NMR spectrum. Accordingly, with reference now also to FIG. 2C, when such spurious voltages arise, then in 304 in an example embodiment, the initial partial spin-echo voltage $V_I(t)$ is filtered at the beginning of the signal (i.e., at time $t=t_i$) to smooth any discontinuities. This is accomplished by performing the operation:

$$V_S(t) = V_I(t) \cdot H(t)$$

where $V_S(t)$ is the smoothed voltage signal and $H(t)$ is a truncated smoothing function, as defined above. Truncated smoothing function $H(t)$ is preferably centered over the data points at the beginning of $V_I(t)$ (i.e., at or near time $t_i$) and may include any smoothly varying function $h(t)$, such as a Gaussian, exponential, sine, cosine, linear, or polynomial function.

Figure 2D:
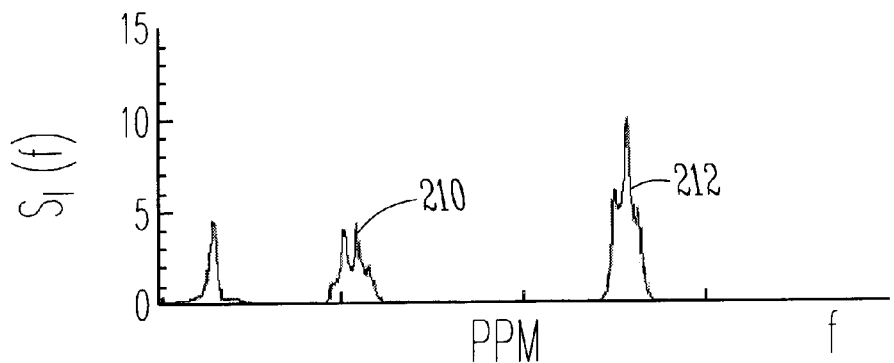
FIG. 2D is a plot of the initial NMR spectrum $S_I(f)$ for ethanol obtained from Fourier-transforming the smoothed initial voltage signal $V_S(t)$, wherein the NMR spectrum shows less-than-optimum resolution of the resonances associated with the ethanol methylene quartet and methyl triplet.

With reference now also to FIG. 2D, in 305 an initial NMR spectrum $S_I(f)$ is obtained by Fourier-transforming the smoothed initial voltage signal $V_S(t)$, i.e., by performing the operation $F\{V_S(t)\}$. The initial spectrum $S_I(f)$ of FIG. 2D shows resonances 210 and 212 associated with the known ethanol methylene quartet and the methylene triplet, respectively. Note that the individual peaks within the quartet resonance 210 and triplet resonance 212 are not fully resolved. Initial spectrum $S_I(f)$ includes a phase term $\phi_I$, not shown in the plot; only the real part of $S_I(f)$ is plotted.

In order to more fully resolve the resonance peaks in initial spectrum $S_I(f)$, the missing data from voltage signal $V_I(t)$ is needed to create a reconstructed spin-echo voltage signal $V_R(t)$. Thus, with reference now to FIG. 4 and flow diagram 400, and also to FIGS. 2E–2G, example embodiments of the iterative method for recovering the missing data from voltage $V_I(t)$ and the reconstruction of a high-quality NMR spectrum are now described.

In 401, an index q that represents the iteration number is set to 1. Then, in 402, a phase-constrained spectrum $S_C(f)$ is defined by taking initial spectrum $S_I(f)$ obtained in step 305, described above, and replacing its phase $\phi_I$ with the low-resolution phase $\phi_{LR}$ derived in 303, also described above. This replacement is performed because the low-resolution phase $\phi_{LR}$ is generally a better approximation to the phase portion of the spectral content of the entire spin-echo voltage signal than is the phase $\phi_I$ associated with just the partial spin-echo voltage signal.

Figure 2E:
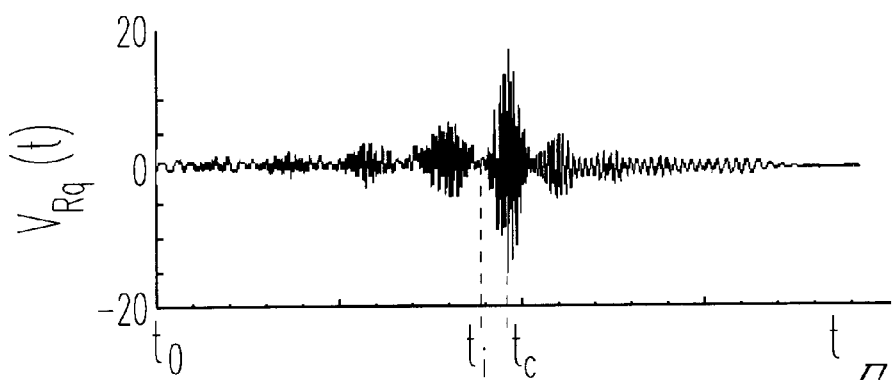
FIG. 2E is a plot of a first iteration (i.e., q=1) of the reconstructed voltage signal $V_{Rq}(t)$, wherein voltage signal data for time $t<t_i$ first appears.

Next, in 403 the operation $F^{-1}\{S_C(f)\}$ is performed to obtain a first iteration (q=1) of reconstructed spin-echo voltage signal $V_{Rq}(t)$. With reference to FIG. 2E, the portion of reconstructed voltage $V_{Rq}(t)$ after time $t_i$ resembles that of $V_S(t)$ but is differs therefrom by an amount corresponding the difference in phase between $\phi_{LR}$ and $\phi_I$. In addition, reconstructed voltage signal $V_{Rq}(t)$ now includes values prior to time $t_i$ that correspond to the reconstructed data missing from $V_S(t)$.

Next, in 404 the values of $V_{Rq}(t)$ for $t>t_i$ are replaced with those from $V_S(t)$. In other words, the altered data for time $t>t_i$ is replaced with the original data, while leaving the newly recovered data for $t<t_i$ in place. This replacement, which results in a modified reconstructed voltage signal (which is still referred to as $V_{Rq}(t)$) ensures that the iteration will converge to a solution that contains the original raw data.

In 405, $V_{Rq}(t)$, which now contains the original raw data plus new data for time $t<t_i$, is Fourier-transformed to create a new initial spectrum $S_{Iq+1}(t)$ with a new phase $\phi_{Iq+1}$. The inquiry is made in 406 whether q=1. If the answer is yes, then in 407, q is set to q+1(i.e., q is incremented by 1 so that now q=2), and 402–405 are repeated. For iterations beyond the first (q=1), the method proceeds to 408, wherein the values of $V_{R_{q+1}}(t)$ for t<ti are compared to the values $V_{R_q}(t)$ for t<$t_i$ from the previous iteration. If the iteration results in a difference that exceeds a predetermined threshold, then another iteration is performed. Iteration of 402–408 is conducted until the difference between reconstructed voltage signals from adjacent iterations (i.e., $V_{R_{q+1}}(t)$ and $V_{R_q}(t)$) is sufficiently small i.e., until adequate convergence is achieved as determined in 408. This iteration process, in practice, typically involves about 10 cycles to achieve satisfactory convergence. The convergence may be deduced by comparing two or more data points in $V_{R_q}(t)$ and $V_{R_{q-1}}(t)$ and ensuring that the difference is less than a predetermined value, which may be a percent change, such as 2%. FIG. 2F is a plot of a reconstructed spin-echo voltage signal $V_R(t)$, starting from a time $t_0 < t_i$.

Figure 2F:
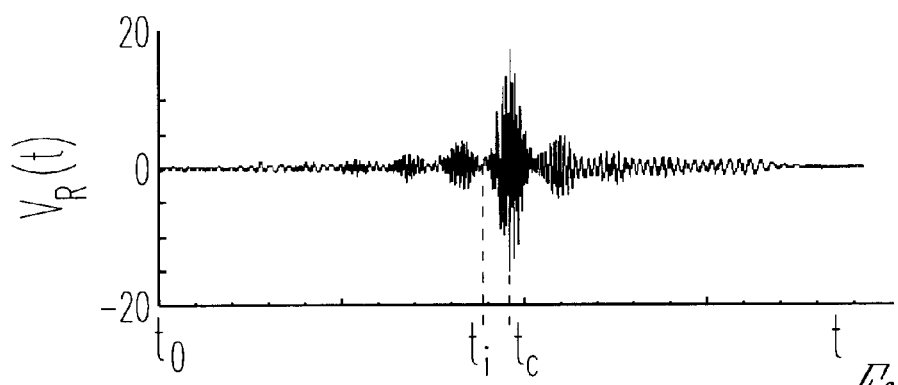
FIG. 2F is a plot of the reconstructed spin-echo voltage signal $V_R(t)$ for ethanol as reconstructed from the initial partial spin-echo voltage signal $V_I(t)$ after a sufficient number of iterations have been performed to achieve adequate convergence.
Figure 2G:
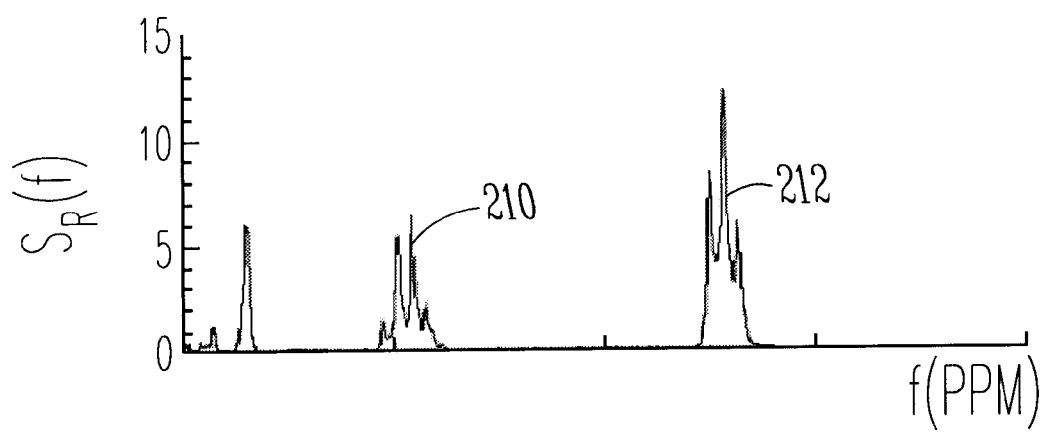
FIG. 2G is a plot of the reconstructed NMR spectrum $S_R(f)$ for ethanol based on the reconstructed voltage signal $V_R(t)$ of FIG. 2F.

With reference again to FIG. 4, the method then proceeds to 408, where the operation $$F\{V_{R_q}(t)\} = S_R(f)$$

is performed to obtain the reconstructed spectrum, as shown in FIG. 2F (this operation could also be performed on $V_{R_{q+1}}(t)$, since at this point the two signals are substantially the same). Comparison of FIG. 2G to FIG. 2D shows a higher resolution in the resonances 210 and 212 associated with the ethanol methylene quartet and methyl triplet, respectively, in the reconstructed spectrum $S_R(f)$ of FIG. 2G. Further, since the signal energy is predominantly concentrated in the center part of the echo, the method of the present invention improves the signal to noise ratio.

Experimental Results

Two different experiments involving NMR spectrum reconstruction were performed using the apparatus and method of the present invention as described below.

EXAMPLE 1

In vivo Application

Figure 5A:
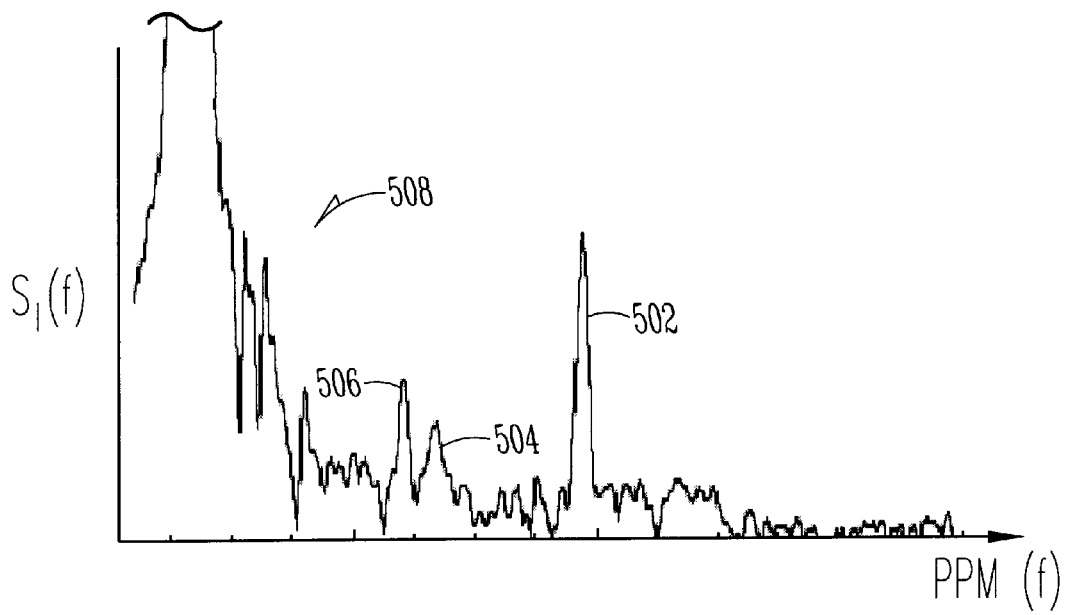
FIG. 5A is a localized hydrogen NMR spectrum of an in vivo sample of an HIV patient using a conventional NMR spectrum apparatus and method.

FIG. 5A is a localized hydrogen spectrum, which was obtained from the brain of a HIV patient using the standard PRESS technique in a conventional NMR spectroscopy apparatus (TR=1500 msec, TE=136 msec, voxel sizes: 15 mm×15 mm×15 mm, number of signal averages (NSA)= 128). The experiment was performed on the Phillips Gyroscan ACS-NT 1.5 Tesla clinical MR system. The total data sampling duration was 1022.4 msec with 1024 complex points sampled, which corresponds to a spectral bandwidth of 1000 Hz or a spectral resolution of 0.98 Hz/pixel. Resonance peaks 502–508 correspond to that for NAA (N-acetylaspartate), Cre (creatine), Cho (choline) and water, respectively.

Figure 5B:
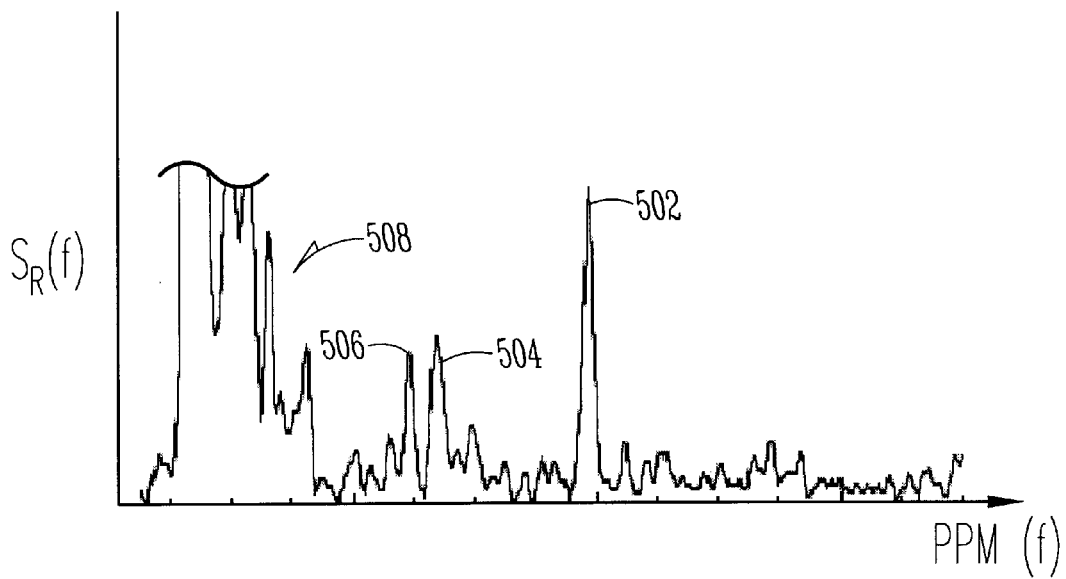
FIG. 5B is the localized hydrogen NMR spectrum of the in vivo sample of FIG. 5A reconstructed using the apparatus and method of the present invention.

FIG. 5B is the same localized hydrogen spectrum reconstructed using the method and apparatus of the present invention (TR=1500 msec, TE=136 msec, voxel sizes: 15 mm×15 mm×15 mm, NSA=64). About a 30% gain in SNR was obtained. Spectrum broadening was reduced to due to the elimination of the dispersive imaginary part of the spectrum upon reconstructing the symmetric spin-echo signal. In addition, the spectral resolution was improved to 0.52 Hz/pixel. As can be seen in FIG. 5B, resonance peaks 502–508 are more pronounced, with the water peak 508 showing more detail and a reduced extended shoulder. Further, the baseline of the spectrum is noticeably improved.

EXAMPLE 2

Brain Tumor

Figure 6A:
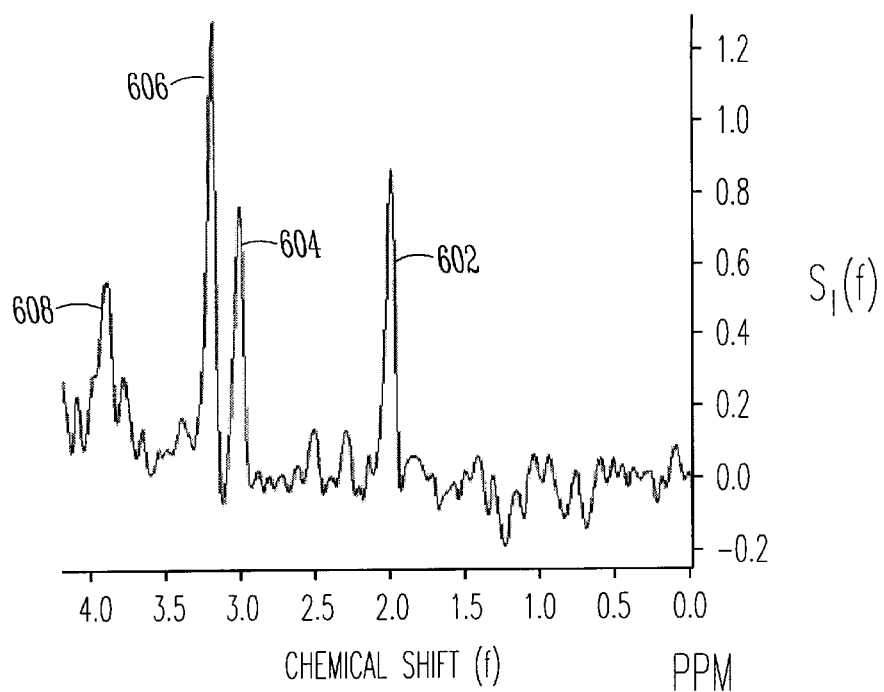
FIG. 6A is a localized hydrogen NMR spectrum of a brain tumor using a conventional NMR spectrum apparatus and method.

FIG. 6A is a localized hydrogen spectrum, which was obtained from brain tumor of a patient using the standard PRESS in a conventional spectroscopy apparatus (TR=1500 msec, TE=137 msec, voxel sizes: 15 mm×15 mm×15 mm, NSA=128). The experiment was performed on the Phillips Gyroscan ACS-NT 1.5 Tesla clinical MR system. The total data sampling duration was 1022.4 msec with 1024 complex points sampled, which corresponds to a spectral bandwidth of 1000 Hz or a spectral resolution of 0.98 Hz/pixel. Resonance peaks 602–608 correspond to that for NAA (N-acetylaspartate), Cre (creatine), Cho (choline) and water shoulder, respectively.

Figure 6B:
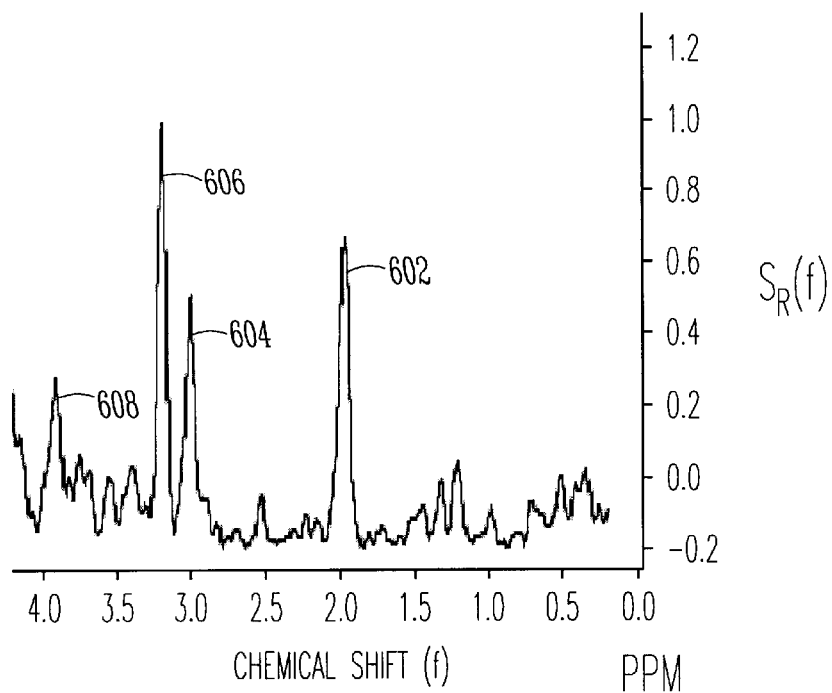
FIG. 6B is the localized hydrogen NMR spectrum of the brain tumor of FIG. 6A reconstructed using the apparatus and method of the present invention.

FIG. 6B is the same localized hydrogen spectrum reconstructed using the new method (TR=2000 msec, TE=137 msec, voxel sizes: 15 mm×15 mm×15 mm, NSA=64). Again, about a 30% gain in SNR was obtained and spectrum broadening was reduced to due to the elimination of the dispersive imaginary part of the spectrum upon reconstructing the symmetric signal. In addition, the spectral resolution was improved. As can be seen in FIG. 6B, resonance peaks 602–608 are more pronounced, with a reduced water shoulder 608. Also, the baseline of the spectrum is noticeably improved.

Conclusion

A new and robust NMR spectrum reconstruction method and apparatus has been described. The method makes available the pre-echo-center maximum data points (i.e., data prior time $t_i$), thereby allowing for a better-quality NMR spectrum with sharper peaks.

In biological applications, the residual water peak is better localized, even in the absolute display mode. In addition, the extended shoulder in the spectrum corresponding to the residual water peak is reduced significantly. The background or baseline of the resulting spectrum is also noticeably improved.

Since the apparatus and method of the present invention allows for the spectrum to be obtained automatically (i.e., without manual intervention) and displayed in absolute display mode, it is free of errors due to the improper phase adjustment in the spectrum domain. Also, as a result of the improved baseline, more resonance peaks emerge from the region close to the water peak, as well as from other areas. Furthermore, the technique can be advantageous for application at higher magnetic fields, since the larger spectrum splitting in frequency for high fields permits a shorter data sampling time for achieving the same spectral resolution.

While the present invention has been described in connection with preferred embodiments, it will be understood that it is not so limited. On the contrary, it is intended to cover all alternatives, modifications and equivalents as may be included within the spirit and scope of the invention as defined in the appended claims

What is claimed is:

1. A computer-readable medium having computer-executable instructions to cause a computer to perform a method of reconstructing spin-echo data from partial spin-echo data that begins at a time t=$t_i$ and that has an echo-center portion, in order to obtain an NMR spectrum of a sample, comprising:

Fourier-transforming the echo-center portion to obtain a low-resolution phase $\phi_{LR}$;

smoothing the partial spin-echo data around the initial time t=$t_i$, thereby obtaining smoothed partial spin-echo data;

Fourier-transforming the smoothed partial spin-echo data to obtain an initial NMR spectrum $S_{Iq}$ having an initial phase $\phi_{Iq}$;

replacing the initial phase $\phi_{I_q}$ in NMR spectrum $S_{I_q}$ with the low-resolution phase $\phi_{LR}$, thereby forming phase-constrained NMR spectrum $S_{C_q}$;

inverse Fourier-transforming the phase-constrained spectrum $S_{C_q}$ to form reconstructed spin-echo data $V_{R_q}$ having data for time $t<t_i$;

replacing the data in the reconstructed spin-echo data $V_{R_q}$ for a time $t>t_i$ with the smoothed partial spin-echo data and then Fourier-transforming $V_{R_q}$ with the smoothed partial spin-echo data to obtain an initial spectrum $S_{I_{q+1}}$ with an initial phase $\phi_{I_{q+1}}$; and repeating the replacing of the initial phase, the inverse Fourier-transforming of the phase-constrained spectrum and the replacing the data in the reconstructed spin-echo data until the reconstructed data $V_{R_q}$ for adjacent iterations are sufficiently close to one another.

2. A computer-readable medium according to claim 1, further including Fourier transforming the reconstructed data to obtain the NMR spectrum.

3. A computer-readable medium according to claim 2, further including comparing two or more data points in adjacent iterations of reconstructed data $V_{R_q}$ to assess the amount of change in the reconstructed data between the adjacent iterations.

4. A computer-readable medium according to claim 3, wherein the partial spin-echo data is in the form of a voltage signal versus time.

5. A computer-readable medium according to claim 4, wherein Fourier transforming the echo-center portion includes filtering the echo-center from the partial spin-echo data by multiplying the partial spin-echo data with a rectangular bandpass function.

6. A computer-readable medium having computer-executable instructions to cause a computer to perform the method of claim 5 wherein smoothing the partial spin-echo data includes filtering the partial spin-echo data with a truncated smoothing function centered at or near time $t_i$.

7. A computer-readable medium having computer-executable instructions to cause a computer to perform a method of forming a high-resolution NMR spectrum, comprising:

acquiring an initial partial spin-echo signal from a sample, the signal beginning at a time $t=t_i$ and having an echo-center portion;

obtaining from the echo-center portion a low-resolution phase;

Fourier-transforming the partial spin-echo signal to obtain an initial spectrum having an initial phase;

replacing the initial phase in the initial spectrum with the low-resolution phase to create a phase-constrained spectrum;

inverse Fourier-transforming the phase-constrained spectrum to obtain a reconstructed signal having data for time $t<t_i$;

replacing the data for time $t>t_i$ in the reconstructed signal with that of the initial signal to form a modified reconstructed signal and Fourier-transforming the modified reconstructed signal to obtain a new initial spectrum with a new initial phase;

iterating the steps from replacing the initial phase in the initial spectrum with the low-resolution phase, to obtaining a reconstructed signal until the reconstructed remains substantially unchanged from the previous iteration; and Fourier-transforming the reconstructed signal to obtain the NMR spectrum.

8. A computer-readable medium of claim 7, wherein obtaining a low-resolution phase includes Fourier-transforming the echo center portion.

9. A computer-readable medium of claim 8, further including smoothing the initial partial spin-echo signal around time $t_i$ to reduce discontinuity artifacts.

10. A computer-readable medium having computer-executable instructions to cause a computer to perform the method of reconstructing a spin-echo signal from an initial partial spin-echo signal having an echo-center and a corresponding initial partial spin-echo spectrum with an initial phase, comprising:

a) extracting a low-resolution phase term from the initial partial spin-echo signal;

b) forming a reconstructed spin-echo signal using the low-resolution phase term;

c) modifying the reconstructed spin-echo signal to include the initial partial spin-echo signal; and d) iterating acts b) and c) using the modified reconstructed spin-echo signal formed in c) in b) until the modified and reconstructed spin-echo signals have a sufficiently small difference.

11. A computer-readable medium according to claim 10, further including instructions to cause a computer to Fourier-transform either the reconstructed spin-echo signal or the modified reconstructed spin-echo signal resulting from d) to obtain an NMR spectrum.

12. In a computer system having a processor, a method of reconstructing a spin-echo signal from an initial partial spin-echo signal having an echo-center and a corresponding initial partial spin-echo spectrum with an initial phase, comprising:

a) in the processor, extracting a low-resolution phase term from the initial partial spin-echo signal;

b) forming in the processor a reconstructed spin-echo signal using the low-resolution phase term;

c) in the processor, modifying the reconstructed spin-echo signal to include the initial partial spin-echo signal; and d) iterating acts b) and c) in the processor using the modified reconstructed spin-echo signal formed in c) in b) until the modified and reconstructed spin-echo signals have a sufficiently small difference.

13. A method according to claim 12, wherein the initial partial spin-echo signal is a voltage signal.

14. A method according to claim 12, wherein the acts therein are performed in order.

15. A method according to claim 12, further including in the processor Fourier-transforming either the reconstructed spin-echo signal or the modified reconstructed spin-echo signal resulting from d) to obtain an NMR spectrum.

16. A computer-readable medium having computer-executable instructions to cause a computer to perform a method comprising:

a) extracting a low-resolution phase term from a detected partial spin-echo signal;

b) forming a reconstructed spin-echo signal using the low-resolution phase term and the detected partial spin-echo signal;

c) modifying t he reconstructed spin-echo signal to include the detected partial spin-echo signal; and d) iterating acts b) and c) until the modified and reconstructed spin-echo signals adequately converge.

17. A computer-readable medium of claim 16, wherein said forming of the reconstructed spin-echo signal includes filtering the detected partial spin-echo signal with a low-pass filter centered about an echo center of the detected partial spin-echo signal.

18. A computer-readable medium of claim 16, wherein the computer-readable medium comprises an electrical signal traveling over a communications medium.

19. A computer-readable medium of claim 18, wherein the communications medium includes an Internet.

20. In a computer system, performing a method comprising:
   a) obtaining a low-resolution phase term from a detected partial spin-echo signal;
   b) forming a reconstructed spin-echo signal using the low-resolution phase term;
   c) modifying the reconstructed spin-echo signal to include the detected partial spin-echo signal; and
   d) iterating acts b) and c) until the modified and reconstructed spin-echo signals have a sufficiently small difference.

21. A method in a computer system of claim 20, wherein the detected spin-echo signal is a voltage signal.

22. A method in a computer system of claim 20, wherein the method includes Fourier-transforming either the reconstructed spin-echo signal or the modified reconstructed spin-echo signal resulting from d) to obtain an NMR spectrum.

23. A method in a computer system of claim 22, further including displaying the NMR spectrum.

24. A method in a computer system of claim 20, wherein the method includes filtering the detected partial spin-echo signal.

25. A method in a computer system of claim 24, further including Fourier-transforming the filtered detected partial spin-echo signal.

26. A method in a computer system of claim 23, including detecting the detected signal using point resolved spectroscopy (PRESS).

27. A method in a computer system of claim 20, including providing the detecting the partial spin echo signal to the computer system from a remote computer system over a communications medium.

28. A method in a computer system of claim 27, wherein the communications medium includes an Internet.

29. A method in a computer system of claim 20, including storing instructions for carrying out the method on a computer-readable medium in the computer system.

30. AS method in a computer system of claim 29, wherein the computer-readable medium includes one of a hard-drive, a compact-disk (CD) and a floppy disk.

* * * * *

UNITED STATES PATENT AND TRADEMARK OFFICE
CERTIFICATE OF CORRECTION

PATENT NO. : 6,639,405 B2
DATED : October 28, 2003
INVENTOR(S) : Kamil Ugurbil, Haiying Liu, Wei Chen It is certified that error appears in the above-identified patent and that said Letters Patent is hereby corrected as shown below:

<u>Column 12,</u>
Line 61, delete " t he" and insert -- the -- therefor.

<u>Column 14,</u>
Line 9, delete "claim 23" and insert -- claim 25 -- therefor.

Signed and Sealed this

Eighth Day of June, 2004

JON W. DUDAS
*Acting Director of the United States Patent and Trademark Office*